US006622107B1

(12) United States Patent
West

(10) Patent No.: US 6,622,107 B1
(45) Date of Patent: Sep. 16, 2003

(54) EDGE PLACEMENT AND JITTER MEASUREMENT FOR ELECTRONIC ELEMENTS

(75) Inventor: Burnell G. West, Fremont, CA (US)

(73) Assignee: NPTest LLC, San Jose, CA (US)

( * ) Notice: Subject to any disclaimer, the term of this patent is extended or adjusted under 35 U.S.C. 154(b) by 251 days.

(21) Appl. No.: 09/648,716

(22) Filed: Aug. 25, 2000

(51) Int. Cl.$^7$ ............................................... G06F 13/00
(52) U.S. Cl. ....................... 702/117; 702/118; 702/119; 702/120; 702/124
(58) Field of Search ...................... 702/66, 79, 117–120, 702/124, 125; 324/612; 327/261, 165; 714/724; 331/25; 365/226

(56) References Cited

U.S. PATENT DOCUMENTS

| | | | | |
|---|---|---|---|---|
| 4,806,852 A | * | 2/1989 | Swan et al. ..................... | 324/73 |
| 6,058,057 A | * | 5/2000 | Ochiai et al. ................ | 365/201 |
| 6,092,030 A | * | 7/2000 | Lepejian et al. .............. | 702/79 |
| 6,263,463 B1 | * | 7/2001 | Hashimoto ................... | 714/724 |
| 6,335,893 B1 | * | 1/2002 | Tanaka et al. ............... | 365/226 |

OTHER PUBLICATIONS

Burnell G. West, "Accuracy Requirement in At–Speed Functional Test", International Test Conference 1999 (IEEE Philadelphia Section, Sep. 28–30, 1999, Paper 30.1), pp. 780–787.

"Product Catalog", National Instruments, Jun. 19, 2000, (http://sine.ni.com/apps/we/nioc/vp?lang=US&pc=mn&cid=3589).
"16 ×4 Bit Register File (RAM)", MC10H145, Motorola Semiconductor Technical Data, (Motorola, Inc. 1996), pp. 2–234 to 2.236(5 pgs.).
"8–Bit Synchronous Binary Up Counter", MC10E016, MC100E016, (Motorola, Inc. 1996), pp. 2–2 to 2–7 (8 pgs.).
"Differential Data and Clock D Flip–Flop", MC10EL52, MC100EL52, (Motorola, Inc. 1996), p. 3–2 (3 pgs.).
"Line Stretchers", "Coaxial Trombone", Microlab/FXR ST series, 1 pg.

* cited by examiner

Primary Examiner—Marc S. Hoff
Assistant Examiner—Felix Suarez

(57) ABSTRACT

An apparatus compares propagation delay of electronic by using flip-flops or similar storage elements. The apparatus includes a strobe source having an output line coupled to a control terminal of a pattern source and an input terminal of a variable clock delay. The strobe source triggers the pattern source to output signal a sequence of signals to an input terminal of an element or device under test (DUT). The DUT propagates the signals to a flip-flop. The output signal of the flip-flop is captured after a delay. The propagation delay of the DUT is determined by coinciding the clock signal edge with the data signal edge to the flip-flop so that the flip-flop enters the ambiguity region. Once the delay settings that define the ambiguity region under the same delay are determined for various DUTs, they are compared to determine which DUT has the least propagation delay.

27 Claims, 9 Drawing Sheets

EDGE PLACEMENT AND JITTER MEASUREMENT FOR ELECTRONIC ELEMENTS

FIELD OF INVENTION

This disclosure relates to testing of electronic elements, and more particularly to an apparatus and a method that measure propagation delay, setup time, and hold time of electronic elements under tests.

BACKGROUND

Accurate timing measurements of propagation delay, setup time, and hold time of electronic components are necessary to design modern electronic instruments and test systems. A way to describe the timing measurement of a signal is to characterize the signal as an edge, which is a transition between two voltage levels representing logic zero and logic one in a digital system, and specify the placement accuracy of that edge with respect to a specified position.

Automatic test systems designed to characterize or qualify integrated circuits (ICs) are frequently specified to have a signal edge placement accuracy measured in picosecond (ps), such as±50 ps. The edge placement accuracy of such automatic test systems incorporates accumulated errors from a number of different components in the timing path of the automatic test systems. These components must be characterized and qualified with precision far better than the capability of the automatic test systems because the errors from each of these components accumulate in the path. In addition, if the errors are systematic errors, they may add directly depending on their nature. Furthermore, if the errors are due to random noise, they may add in quadrature (i.e., each error is squared and their sum square rooted). Thus, it is necessary to know very precisely the systematic and the random components of the timing errors introduced by all the components in the timing path of the automatic test systems in order to assure that the automatic test systems meet a specified edge placement accuracy.

There are many instruments designed to measure timing characteristics of electrical signals, including real-time oscilloscopes, sampling oscilloscopes, time interval meters, and spectrum analyzers. To measure their accuracy and stability, these instruments measure a signal passing through a precisely known delay path. The measurements of these instruments are compared to a time delay derived from the known length of the delay path. One such delay path is a coaxial signal line. In a coaxial signal line, the propagation delay of an electrical signal is known to be the speed of light in a vacuum multiplied by the inverse of the square root of the dielectric constant of the dielectric material separating the inner and outer conductors of the coaxial signal line. The dielectric material can be air if the coaxial signal line is rigid metal. The dielectric constant of air is well known at any given temperature and humidity. One such known coaxial signal line is formed from two variable-length rigid air-dielectric delay lines paired with a U-junction hereafter known as a "trombone."

A conventional high performance oscilloscope has an accuracy of ½ to 1 picoseconds. As the demand for more accurate automatic test equipment increases, the demand for more accurate instruments used to characterize and qualify the components of automatic test equipment also increases. Thus, what is needed is an instrument and method that can characterize and qualify electronic components (including integrated circuits and discrete components) of automatic test equipment with greater accuracy.

SUMMARY

An apparatus is provided to compare the propagation delay of electronic elements such as transistors, integrated circuits, and interconnections for integrated circuits. The apparatus includes a strobe source having an output line coupled to a control terminal of a pattern source and an input terminal of a variable clock signal delay. The strobe source triggers the pattern source to output signal a predetermined sequence of logic signals which are "0"s and "1"s to an input terminal of the element or device under test (DUT). The DUT propagates the sequence of logic "0"s and "1"s to a first flip-flop (or other storage element). The first flip-flop propagates the signal received from the DUT to a second flip-flop (or other storage element) each time the first flip-flop is clocked by the variable clock signal delay. The second flip-flop propagates the signal received from the first flip-flop when it is clocked.

To compare the propagation delay of DUTs, the pattern source supplies the same sequence of logic "0"s and "1"s to each DUT. The variable clock signal delay is used to move the clock signal edge to the first flip-flop back and forth so that the first flip-flop receives the clock signal edge at substantially the same time as the data signal edge (i.e., the transition of the DUT output signal from one logic state to another). This timing alignment triggers the flip-flop into a known short-lived intermediate state called "metastability". The second flip-flop stores the output signal of the first flip-flop and ends the metastability of the first flip-flop.

When the first flip-flop receives the clock signal edge and the data signal edge at substantially the same time, the output signal of the first flip-flop is unpredictable (i.e., varies between logic "0" and "1") at the normal propagation delay of the first flip-flop if the setup time or the hold time of the first flip-flop is violated. The range of time that the clock signal edge becomes so close to the data signal edge that the output signal is unpredictable at the normal propagation delay is called the metastable region. The range of time that the clock signal edge becomes so close to the data signal edge that the output signal is unpredictable after a period of time much larger than the normal propagation delay is called the ambiguity region. The ambiguity region can be made short if the output signal of the first flip-flop is given time beyond the normal propagation delay to settle. By moving the clock signal edge to the first flip-flop back and forth in time, the ambiguity region (with the data signal edge located therein) is determined from the output signal of the first flip-flop recorded by the second flip-flop. Thus, the data signal edge can be located with great precision if the second flip-flop propagates the output signal of the first flip-flop after a time extended beyond the normal propagation time of the first flip-flop (extended delay).

In one embodiment, the variable clock delay signal clocks the first flip-flop and the second flip-flop at the same time, which creates a one clock cycle delay to the propagation of the output signal of the first flip-flop by the second flip-flop. The one clock cycle of delay provides the extended delay needed to create a short ambiguity region to locate the data signal edge. After the delays of the variable clock delay that generate the ambiguity regions for the DUTs under the same input and the same extended delay are located, they can be compared to determine which DUT has the least propagation delay. Thus, the apparatus and associated method can characterize and qualify the propagation delays of different DUTs with great accuracy.

An apparatus is further provided to compare the setup time and the hold time .of DUTs. In one embodiment, the variable clock delay provides clock signals to the DUT. To compare the setup time and the hold time of the DUTs, the pattern source supplies the same sequence of logic signal "0"s and "1"s to each DUT. The variable clock delay is used to move the clock signal edge to each DUT back and forth so that the DUT receives the clock signal edge at substantially the same time as the data signal edge (i.e., the transition of the DUT input from one logic state to another). The first flip-flop is used to record the resulting output signal of the DUT.

When the DUT receives the clock signal edge at substantially the same time as the data signal edge, the resulting output signal of the DUT is unpredictable (i.e., varies between logic "0" and "1") at a propagation delay of the DUT if the setup time or the hold time of the DUT is violated. The setup time of the DUT is not satisfied when the clock signal edge does not arrive sufficiently after the data signal edge. The hold time of the DUT is not satisfied when the clock signal edge does not arrive sufficiently prior to the data signal edge. Thus, the range of time that the clock signal edge becomes so close to the data signal edge that the output signal of the DUT is unpredictable (the ambiguity region) is the sum of the setup time and the hold time of the DUT at a propagation delay when the first flip-flop records the output signal of the DUT. By moving the clock signal edge back and forth, the ambiguity regions of each DUT at the same propagation delay is determined from the output signal of the DUT recorded by the first flip-flop.

In one embodiment, the variable clock delay clocks the DUT and the first flip-flop, which creates a one clock cycle delay to the propagation delay at which the first flip-flop records the output signal of the DUT. In other words, the setup time and the hold time of each DUT are determined at the propagation delay of one clock cycle. Once the delays of the variable clock delay that generate all the ambiguity regions of the DUTs at this propagation delay are determined, they can be compared to determine which DUT has the least setup time and hold time. Thus, the apparatus and associated method can characterize and qualify the setup time and the hold time of different DUTs with great accuracy.

BRIEF DESCRIPTION OF THE DRAWINGS

The same reference numbers in different figures indicate the same or like elements.

DETAILED DESCRIPTION

Figure 1:
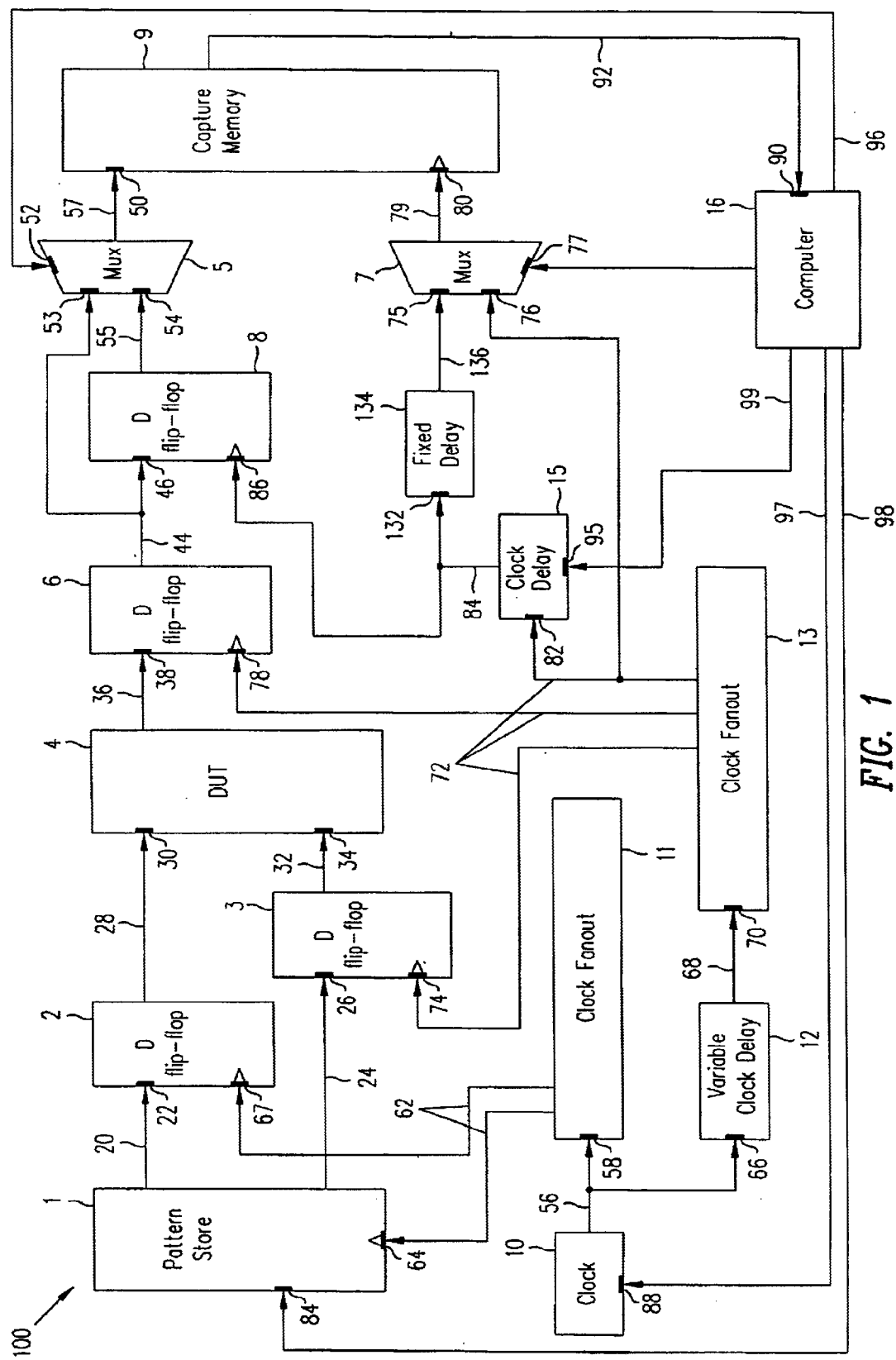
FIG. 1 illustrates a test apparatus in accordance with one embodiment.

FIG. 1 illustrates in a block diagram a test apparatus 100 in accordance with this disclosure. A pattern store 1 has an output line 20 coupled to an input terminal 22 of an edge-triggered D flip-flop 2. Pattern store 1 also has an output line 24 coupled to an input terminal 26 of an edge-triggered D flip-flop 3. Pattern store 1 stores one or more patterns of logic "0"s and "1"s (test patterns) for testing an element or device under test (DUT) 4. Pattern store 1 receives the test pattern from conventional computer 16 via a port 84. Pattern store 1 is, for example, a Motorola MC10H145 16×4 bit register file (RAM) from Motorola Inc. of Schaumburg, Ill. Flip-flops 2 and 3 are, for example, Motorola MC10EL52 differential data and clock D flip-flops. DUT 4 includes integrated circuits, printed circuit board traces, static delay lines, connectors, electro-optical converters, and other electronic components whose signal propagation needs to be characterized or qualified. As one skilled in the art understands, a processor or micro-controller can be used instead of a conventional computer 16 to control the functions of apparatus 100.

Flip-flop 2 has an output line 28 coupled to an input terminal 30 of DUT 4 (not part of apparatus 100). Flip-flop 3 has an output line 32 coupled to an input terminal 34 of DUT 4. In one implementation, terminal 34 is a clock terminal. In that implementation, flip-flop 2 provides the input (data) signal for DUT 4 and flip-flop 3 provides the clock signal to DUT 4. In one implementation, DUT 4 is coupled to apparatus 100 through a conventional test fixture assembly with sockets that match the pins of DUT 4.

Output lines 20 and 24 of pattern store 1 can be directly coupled to respective input terminals 30 and 34. However, as the test patterns become complex, the output signal timing of pattern store 1 becomes less precise. Thus, flip-flops 2 and 3 are used to provide additional control over the output signal timing of the test patterns from pattern store 1. Since flip-flops 2 and 3 receive the same clock signal as pattern store 1, flip-flop 2 and 3 propagate signals received from pattern store 1 to DUT 4 with a delay of one clock cycle.

DUT 4 has an output line 36 coupled to an input terminal 38 of an edge-triggered D flip-flop 6. Flip-flop 6 has an output line 44 coupled to an input terminal 46 of an edge-triggered D flip-flop 8 and an input terminal 53 of a multiplexer (mux) 5. Flip-flop 8 has an output line 55 coupled to an input terminal 54 of mux 5. Mux 5 has an output line 57 coupled to an input terminal 50 of a capture memory 9. Mux 5 is controlled by computer 16 via a control terminal 52. Capture memory 9 is of the same type as pattern store 1. Flip-flops 6 and 8 are of the same type as flip-flops 2 and 3.

A clock signal source (strobe source) 10 has an output line 56 coupled to a clock terminal 58 of a clock fanout 11 and a clock terminal 66 of a variable clock delay 12. Clock 10 is controlled (e.g., clocking or not clocking other components) by a conventional computer 16 via a control terminal 88. Clock 10 is, for example, a conventional gated ring oscillator. Clock fanout 11 is, for example, an Edge El 18 clock fanout from Edge Semiconductor Inc. of San Diego, Calif.

Figure 2:
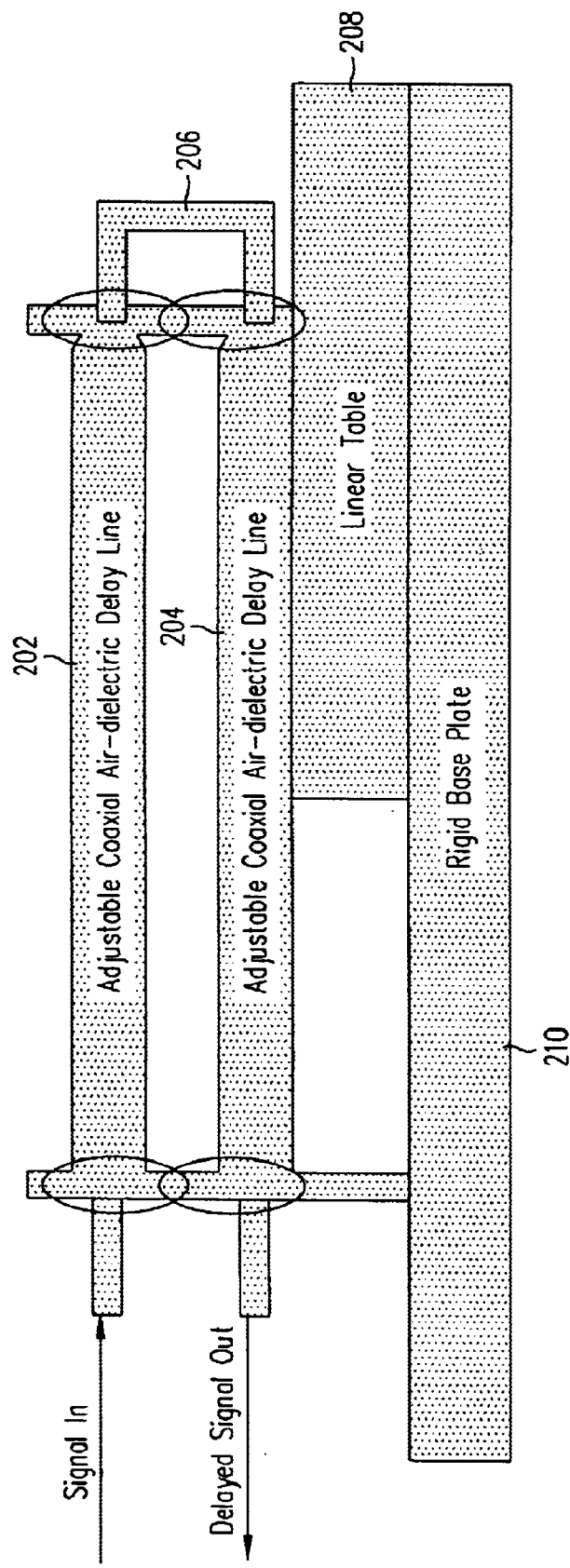
FIG. 2 illustrates an implementation of a variable clock delay structure of FIG. 1.

FIG. 2 illustrates pictorially an implementation of variable clock delay 12. Variable clock delay 12 comprises two adjustable rigid air-dielectric delay lines 202 and 204 having one pair of ends coupled through a U-joint 206 and mounted on a linear positioning table 208, and another pair of ends mounted on a base plate 210 (hereafter collectively known as a trombone). The trombone is, for example, model number ST-05 SMA from Microlab/FXR of Livingston, N.J. Linear positioning table 208 can be adjusted by an associated vernier screw adjustment mechanism that provides a resolution of at least 0.02 mm to the length of lines 202 and 204, which results in a resolution of at least 12 femtoseconds for the overall signal propagation delay through the trombones.

Clock fanout 11 has clock output lines 62 coupled to a clock terminal 64 of pattern store 1 and a clock terminal 67 of flip-flop 2. When clocked, pattern store 1 outputs a logic "0" or "1" to flip-flop 2. Clock delay 12 has a clock output line 68 coupled to a clock terminal 70 of a clock fanout 13, which is of the same type as clock fanout 11. Clock fanout 13 has clock output lines 72 coupled to a clock terminal 74 of flip-flop 3, a clock terminal 78 of flip-flop 6, a clock terminal 82 of a clock delay 15, and an input terminal 76 of mux 7. Clock delay 15 has a clock output line 84 coupled to a clock terminal 86 of flip-flop 8 and an input terminal 132 of a fixed delay 134. Fixed delay 134 has an output line 136 coupled to an input terminal 75 of mux 7. Fixed delay 134 is, for example, a printed circuit board trace delay of approximately one-half nanoseconds (e.g., about 3 inches in length). Mux 7 has an output line 79 coupled to a clock terminal 80 of capture memory 9. Mux 7 is controlled by computer 90 via a control terminal 77.

Figure 3A:
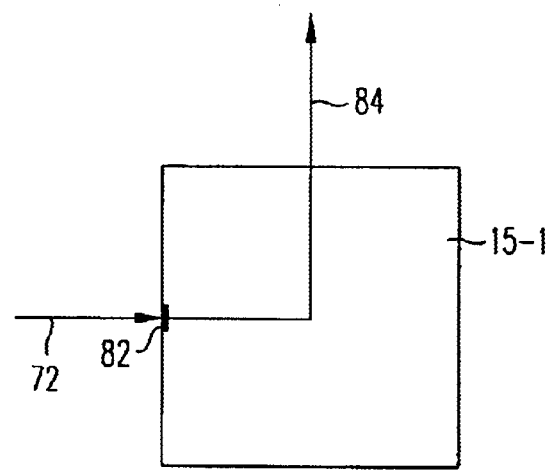
FIG. 3A and FIG. 3B illustrate implementations of a clock delay structure of FIG. 1.

FIG. 3A illustrates one implementation of clock delay 15 hereafter referred to as clock delay 15-1. In clock delay 15-1, terminal 82 is directly coupled to output line 84. Clock delay 15-1 uses the behavior of D flip-flops to create a one clock cycle delay to the signal propagated from flip-flop 6 to flip-flop 8. When clock delay 15-1 is used, flip-flop 6 and flip-flop 8 are clocked by the same clock signal. Thus, when flip-flop 6 outputs a signal to flip-flop 8, flip-flop 8 will not propagate that signal until the next clock cycle when it is clocked.

Figure 3B:
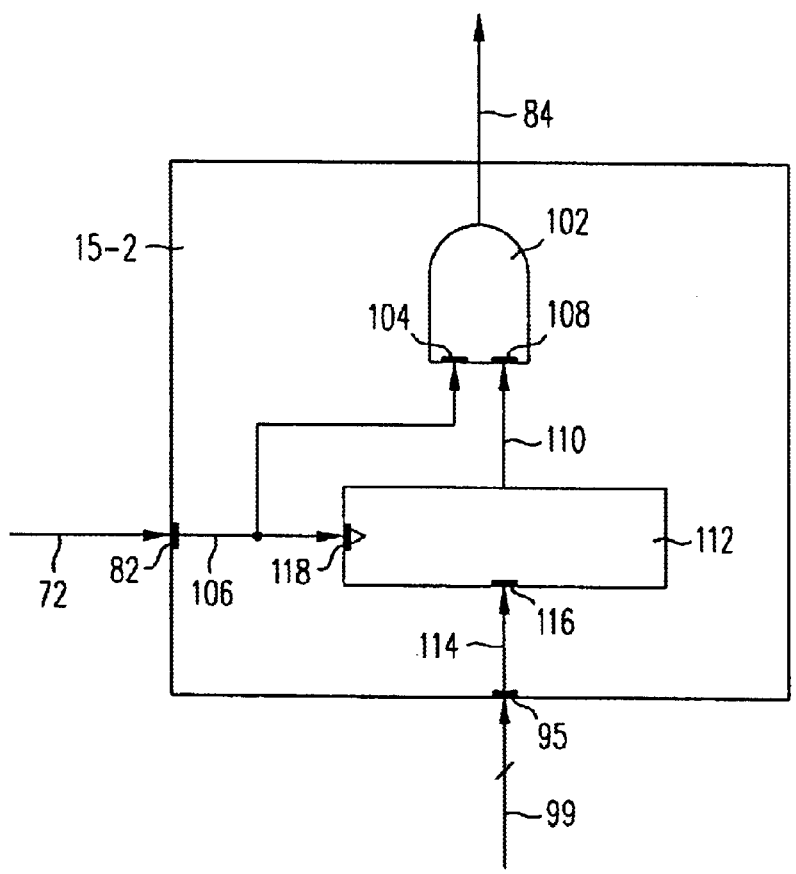

FIG. 3B illustrates schematically another implementation of clock delay 15 hereafter referred to as clock delay 15-2. Clock delay 15-2 comprises an AND gate 102 having an input terminal 104 coupled to terminal 82 via a line 106. AND gate 102 also has an input terminal 108 coupled to an output line 110 of a programmable counter 112. Counter 112 counts the number of clock signals received on input terminal 118 coupled to terminal 82 via line 106. When counter 112 reaches a preset count, counter 112 outputs an active signal on line 110. If AND gate 102 also receives an active signal from terminal 82, AND gate 102 outputs an active signal onto line 84. The preset count of counter 112 is set by computer 16 through a port 116 coupled to a port 95 via a bus 114. Computer 16 can also reset the current count of counter 112 through port 116. Counter 112 is, for example, a Motorola 8-bit synchronous binary up counter MC10E016.

A computer 16 controls the operations of apparatus 100. Computer 16 includes an output line 94 coupled to control terminal 77 of mux 7, an output line 96 coupled to control terminal 52 of mux 5, a bus 99 coupled to a port 95 of clock delay 15, a control line 97 coupled to control terminal 88 of clock 10, and a bus 98 coupled to port 84 of pattern store 1. Computer 16 also includes a port 90 coupled to a bus 92 of capture memory 9 to receive the output results recorded by capture memory 9. In one implementation, computer 16 includes an input/output signal register card that allows computer 16 to control input/output lines. Input/output signal register card is, for example, PCI-6601 from National Instrument of Austin, Tex.

Figure 4:
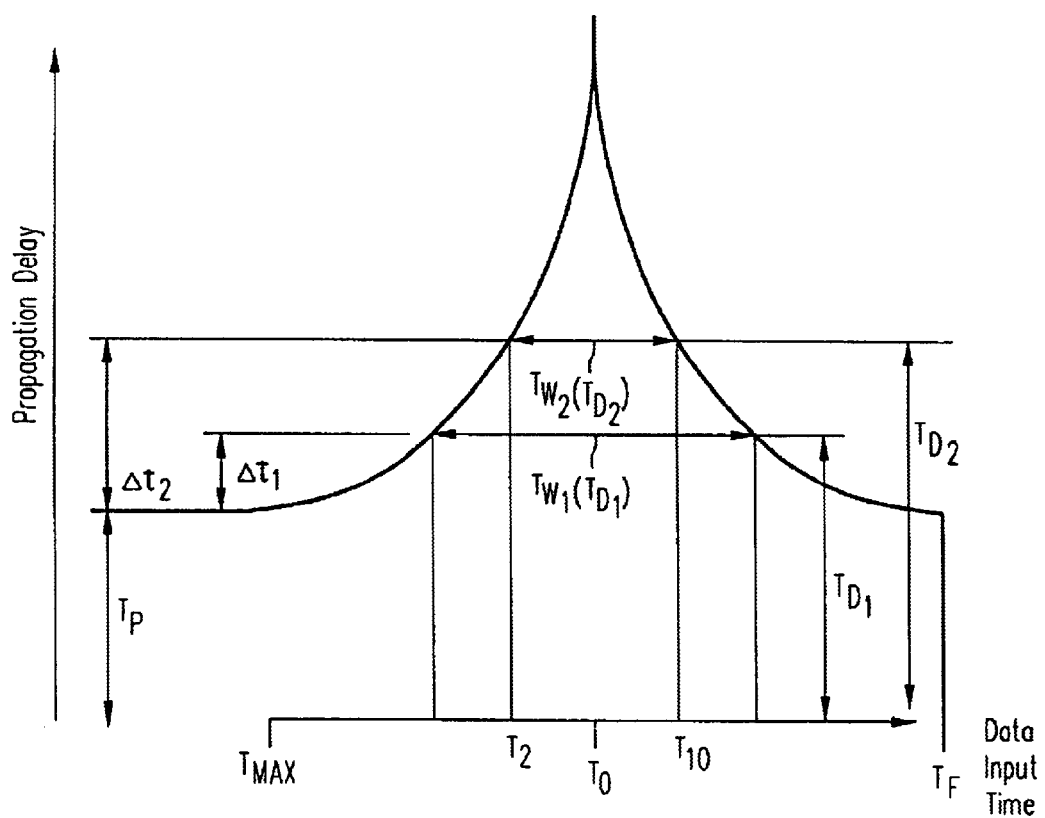
FIG. 4 shows propagation delay as a function of data input time relative to the clock input time.

The equation that expresses the metastability character of a flip-flop is:

$$T_W(T_D) = T_P * 10^{-(\Delta t/\tau)},$$

where $T_W$ is the ambiguity region, $T_D$ is the extended delay, $T_P$ is the normal propagation delay, $\Delta t$ is the excess delay $(T_D - T_P)$, and $\tau$ is the resolution time constant of the flip-flop. FIG. 4 shows graphically the propagation delay caused by the metastability of the flip-flop as a function of the data input time relative to the clock input time. Ambiguity region $T_W$ is the range of data input times relative to the clock input time To for which the output signal of the flip-flop is unpredictable (varies between "0" and "1") at extended delay $T_D$. In other words, the output signal of the flip-flop at extended delay $T_D$ is unpredictable if the data signal edge arrives before or after the clock input time To in the range designated as $T_W$.

These characteristics of a flip-flop are used to locate the data input (data signal edge) time of flip-flop 6, which corresponds to the data output time of DUT 4. If all the DUTs tested by apparatus 100 are subjected to the same input signal, the output signal times of the DUTs then correspond to their relative propagation delay. Flip-flop 6 captures (propagates) the output signal of each DUT under a range of clock signal input (clock signal edge) times controlled via delays created by variable clock delay 12 by varying the length of delay lines 202 and 204. The output signal of flip-flop 6 under each clock input time is repeatedly captured at an extended delay $T_D$. Clock delay 15 generates the clock signal at extended delay $T_D$ to flip-flop 8 so that flip-flop 8 propagates the output signal of flip-flop 6 to capture memory 9 at extended delay $T_D$. Capture memory 9 records the output signal of flip-flop 8 and computer 16 read out the recorded data of capture memory 9. Computer 16 can analyze the recorded data to determine the ambiguity region under extended delay $T_D$, which is located between at least two clock input times (i.e., two delay settings of variable clock delay 12) that cause unpredictable output signals from flip-flop 6.

If clock delay 15-2 is used, flip-flop 8 and capture memory 9 are only clocked once after programmable counter 112 reaches the preset count. The use of clock delay 15-2 conserves memory as only one output signal is recorded by flip-flop 8.

Extended delay $T_D$ to flip-flop 8 sets the resolution in which the data input time can be located (data signal edge resolution). As FIG. 4 illustrates, if the extended delay $T_D$ is increased from $T_{D1}$ to $T_{D2}$, the ambiguity region decreases from $T_{W1}$ to $T_{W2}$. While the embodiment described above uses an extended delay $T_D$ of one clock cycle, greater extended delay $T_D$ can be used to increase the data signal edge resolution. However, data signal edge resolution should not be greater than the resolution by which the clock input times can be adjusted (clock signal edge resolution). If the data signal edge resolution is greater than the clock signal edge resolution, the ambiguity region can be skipped if the output signal measurements are recorded at a data input time at one side of the ambiguity region and another data input time at the other side of the ambiguity region. The previously described trombones (FIG. 2) offer high resolution on the delay for the clock signal edges and thus the data signal edge can be located with high resolution using apparatus 100.

Figure 5:
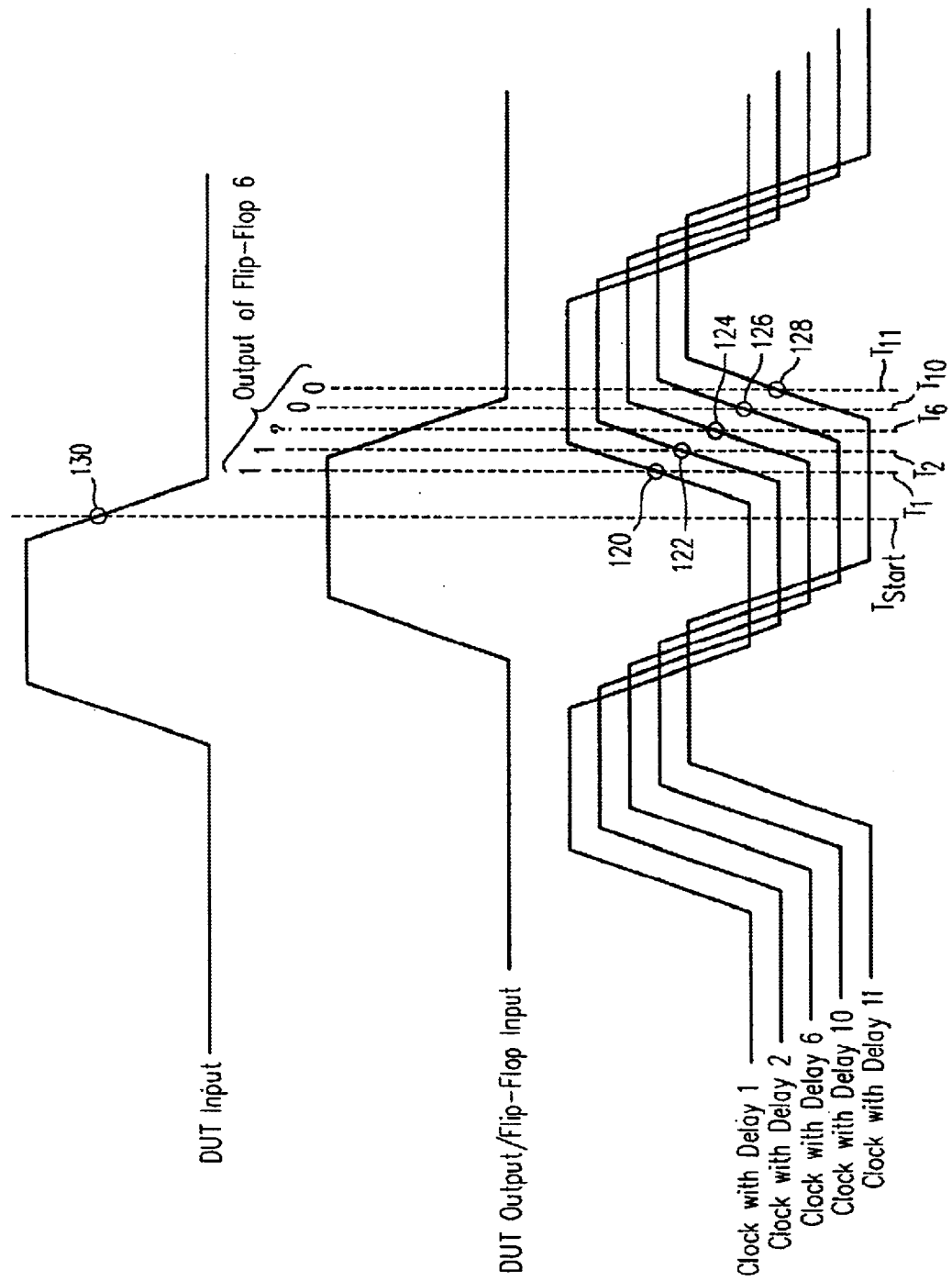
FIG. 5 shows a timing diagram of the input and output signals of the device under test, the clock signals to a flip-flop of FIG. 1 used to capture the output signal of the device under test, and the output signal of a flip-flop.

FIG. 5 shows an exemplary timing diagram of the input signal to DUT 4, the output signal of DUT 4 (the input signal to flip-flop 6), various clock signals to flip-flop 6, and the output signal of flip-flop 6 captured by flip-flop 8. At $T_1$ and $T_2$, respective clock signal edges 120 and 122 arrive at flip-flop 6 sufficiently prior to data signal edge 130 to satisfy the setup time and the hold time of flip-flop 6 so that the output signal of flip-flop 6 is always logic "1" when captured by flip-flop 8 at extended delay $T_D$ (one clock cycle). At $T_6$, clock signal edge 124 arrives at flip-flop 6 at substantially the same time as data signal edge 130 so that the setup time or the hold time of flip-flop 6 is violated. Thus, the output signal of flip-flop 6 varies between "1" and "0" (represented by "?" in the output of flip-flop 6 in FIG. 5) when captured by flip-flop 8 at extended delay $T_D$. At $T_{10}$ and $T_{11}$, respective clock signal edges 126 and 128 arrive at flip-flop 6 sufficiently after data signal edge 130 to satisfy the setup time and the hold time of flip-flop 6 so that the output signal of flip-flop 6 is always logic "0" when captured by flip-flop 8 at extended delay $T_{D2}$.

Figure 6:
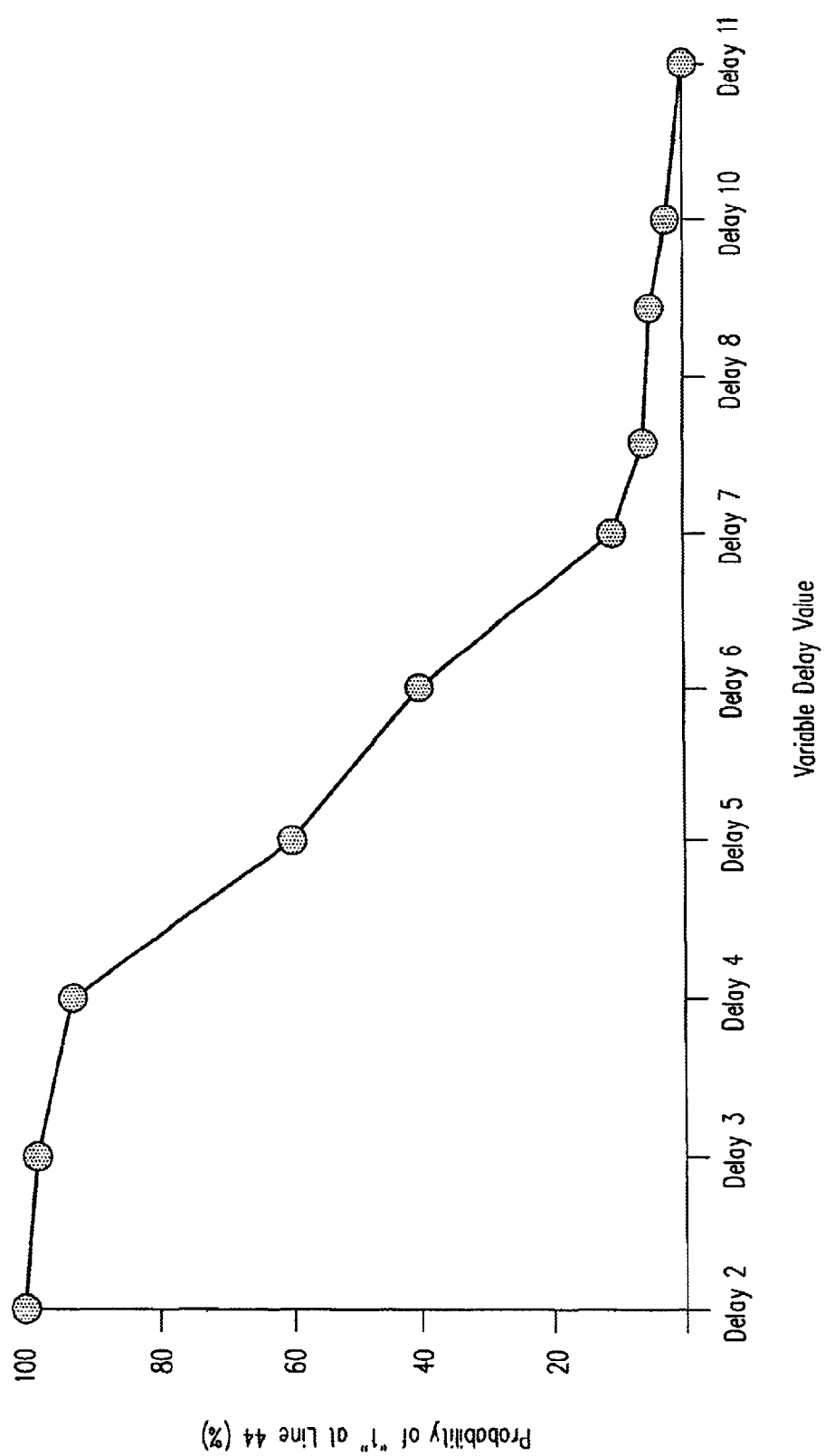
FIG. 6 illustrates the probability of a flip-flop of FIG. 1 recording a logic "1" from the output signal of a flip-flop at various clock signals to a flip-flop.

FIG. 6 shows a plot of the output signal of flip-flop 6 (horizontal axis) as a percentage of logic "1"s recorded at extended delay $T_D$ for DUT 4 from delay 2 to delay 10 (vertical axis). In one implementation, the output signal of flip-flop 6 is measured at least 100 times. At delay 2, the output signal of flip-flop 6 is all "1"s. From delay 3 to delay 9, the output signal of flip-flop 6 is a mixture of "1"s and "0"s and the percentage of logic "1"s decreases from delay 3 to delay 9. At delay 10, the output signal of flip-flop 6 is all "0"s. Thus, the ambiguity region is located at least between delay 2 and delay 10 at extended delay $T_D$. This also means that the data output time of DUT 4, which corresponds to the propagation delay of DUT 4, is located between delay 2 and delay 10 with a resolution of $T_W$. As previously described, $T_W$ can be a small time region depending on extended delay $T_D$. For a Motorola MC10EL52 D flip-flop with τ of 200 ps, $T_P$ of 365 ps, and Δt ($T_D$–$T_P$) of 2.5 nanoseconds, the ambiguity region is only about 8 femtoseconds.

Once the propagation delay for a DUT is located between two delay settings of variable clock delay 12 (e.g., delay 2 and delay 10), another DUT can be tested with the same setup to locate its propagation delay with respect to delay settings of variable clock delay 12. If the delay settings of a first DUT are shorter than the delay settings of a second DUT, the first DUT has a shorter propagation delay than the second DUT. Thus, relative propagation delay among tested DUTs can be determined.

Figure 7:
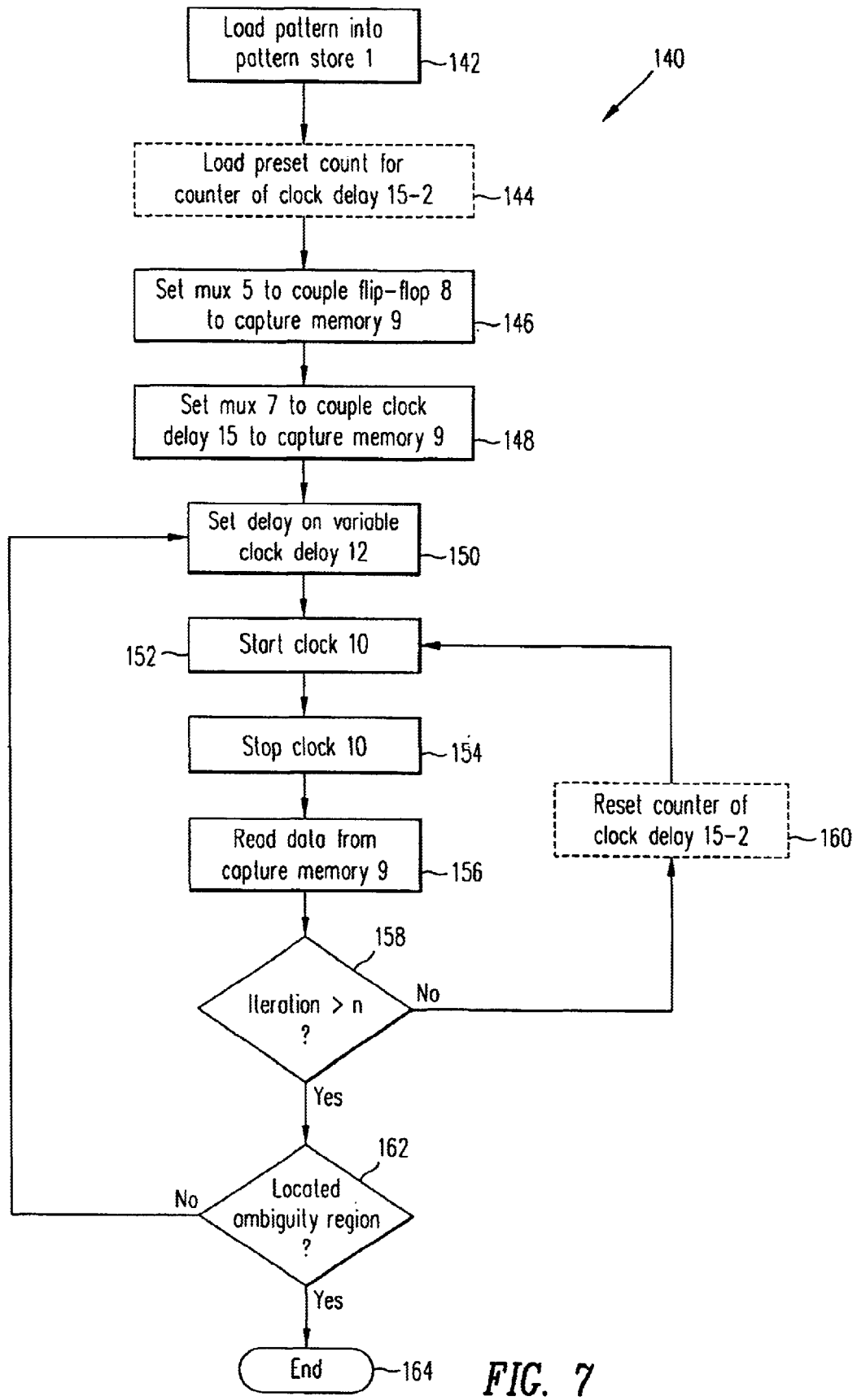
FIG. 7 illustrates a method to compare the propagation delay of devices under test in accordance with one embodiment.

FIG. 7 illustrates a method 140 to compare propagation delay of various DUTs. In action 142, computer 16 loads a test pattern into pattern store 1. In an optional action 144, computer 16 sets the preset count into clock delay 15-2. In action 146, computer 16 sets mux 5 to couple line 55 of flip-flop 8 to terminal 50 of capture memory 9. In action 148, computer 16 sets mux 7 to couple line 136 of fixed delay 134 to terminal 80 of capture memory 9. In action 150, an operator of test apparatus 100 manually sets the delay of variable clock delay 12 by turning the vernier screw adjustment mechanism. Alternatively, a stepper motor controlled by computer 16 can be coupled to turn the vernier screw adjustment mechanism of variable clock delay 12.

In action 152, computer 16 causes clock 10 to clock the other components. In action 154, computer 16 causes clock 10 to terminate the clocking of the other components after a predetermined amount of time. Computer 16 causes clock 10 to terminate the clocking of the other components after, for example, three clock cycles. At a first clock signal edge, pattern store 1 outputs a logic state of the test pattern. At a second clock signal edge, D flip-flop 2 outputs the logic state of the test pattern to DUT 4. After a delay to the second clock signal edge generated by variable clock delay 12, D flip-flop 6 captures the output signal of DUT 4. A clock cycle after that (at a delayed third clock signal edge), D flip-flop 8 captures the output signal of D flip-flop 6. After an additional delay to the delayed third clock signal edge generated by fixed delay 134, capture memory 9 records the output signal of D flip-flop 8.

In action 156, computer 16 reads the recorded data from capture memory 9. If apparatus 100 uses clock delay 15-1 and computer 16 causes clock delay 15 to stop clocking after three clock cycles, capture memory 9 stores a set of three logic states where the last logic state is the test result. Each time the test is repeated, capture memory 9 stores another set of three logic states. By comparing the last logic state between the sets from all the tests at this delay setting of variable clock delay 12, it can be determined whether or not this delay setting corresponds to a point in the ambiguity region. For example, if the last logic state varies between the sets, then this delay corresponds to a point in the ambiguity region shown in FIGS. 4, 5, and 6. If clock delay 15-2 is used, capture memory 9 records only the test result (on the last bit) as it is only clocked once by clock delay 15-2.

In action 158, computer 16 (which is suitably programmed) determines if the nth iteration of testing has been performed. As previously described, n is for example 100. Thus, at each delay setting of variable clock delay 12, 100 iterations of the test is run. If the current iteration is less than n, than action 158 is followed by optional action 160. Otherwise, action 158 is followed by action 162. In optional action 160, computer 16 resets the current count in programmable counter 112 of clock delay 15-2. Optional action 160 is followed by action 152 and the previously described actions cycle until n iterations have been completed.

In action 162, computer 16 determines if the ambiguity region has been located. The ambiguity region has been located if a delay setting generates test results that are all of one logic state (e.g., delay 2 of FIG. 5) and another delay setting generates test results that are all of another logic state (e.g., delay 10 of FIG. 5). As FIG. 5 demonstrates, the finer the precision which the clock delay can be generated, the finer the precision which the ambiguity region can be located. If the ambiguity region has been located, action 162 is followed by action 164, which ends method 140. Otherwise, action 162 is followed by action 150, which sets another delay for variable clock delay 12 and the previous described actions cycle until the ambiguity region is located.

If the propagation delay of the data paths of apparatus 100 is known, the actual propagation delay of DUT 4 can be determined. The time when DUT 4 receives an input can be determined by conventionally calibrating the data path from the clock 10 to DUT 4 through line 56, clock fanout 11, line 66, flip-flop 2, and line 28. The time when flip-flop 6 receives a clock signal edge that puts DUT 4 in the middle of the ambiguity region can also be determined by conventionally calibrating the data path from clock 10 to flip-flop 6 through line 56, variable clock delay 12 (set at the delay that causes metastability), line 68, clock fanout 13, and line 72. The propagation delay of DUT 4 can be determined by subtracting those two times and to the accuracy achieved by the conventional calibration. One skilled in the art can calibrate the data path by (1) time domain reflectometry, (2) the insertion of a DUT of known delay ("reference block"), and (3) the application of measuring apparatus such as a high performance oscilloscope.

Setup time is the length of time that data must be present and unchanging at the input terminal of a device before being clocked. Hold time is the length of time that data must remain unchanged at the input terminal of the device after clocking. The setup time and hold time must be followed for the device to provide the appropriate output signal at a propagation delay specified by the manufacturer (normal propagation delay).

To measure setup time and hold time, pattern store 1 and flip-flop 2 generate test patterns of "0"s and "1"s. In one implementation, pattern store 1 supplies a pattern of "1 0" to flip-flop 2 and DUT 4 receives the pattern from output line 28 of flip-flop 2. DUT 4 also receives delayed clock signals at terminal 34 from output line 32 of flip-flop 3. Flip-flop 3 receives from pattern store 1 a pattern of "0 1" used by flip-flop 3 to generate the clock signals to DUT 4. Flip-flop 3 is clocked by a clock signal delayed by variable clock delay 12. Variable clock delay 12 is used to move the clock signal edge from flip-flop 3 to DUT 4 back and forth to coincide with the data signal edge to DUT 4 from flip-flop 2. Flip-flop 6 captures the output signal of DUT 4. As flip-flop 6 and DUT 4 share the same clock signal edge delayed by variable clock delay 12, flip-flop 6 captures the output signal of DUT 4 after a one clock cycle delay. Thus, the setup time and the hold time are measured at a propagation delay of one clock cycle.

When DUT 4 receives the clock signal edge at substantially the same time as the data signal edge, the output signal of DUT 4 is unpredictable (i.e., varies between logic "0" and "1") at a propagation delay if the setup time or the hold time of the DUT is violated. The setup time of the DUT is not satisfied when the clock signal edge does not arrive sufficiently after the data signal edge. The hold time of the DUT is not satisfied when the clock signal edge does not arrive sufficiently prior to the data signal edge. Thus, the range of time that the clock signal edge becomes so close to the data signal edge that the output signal of the DUT is unpredictable (the ambiguity region) is the sum of the setup time and the hold time of the DUT at that propagation delay. By moving the clock signal edge back and forth, the ambiguity regions of each DUT at the same propagation delay is determined from the output signal of the DUT recorded by the first flip-flop.

Figure 8:
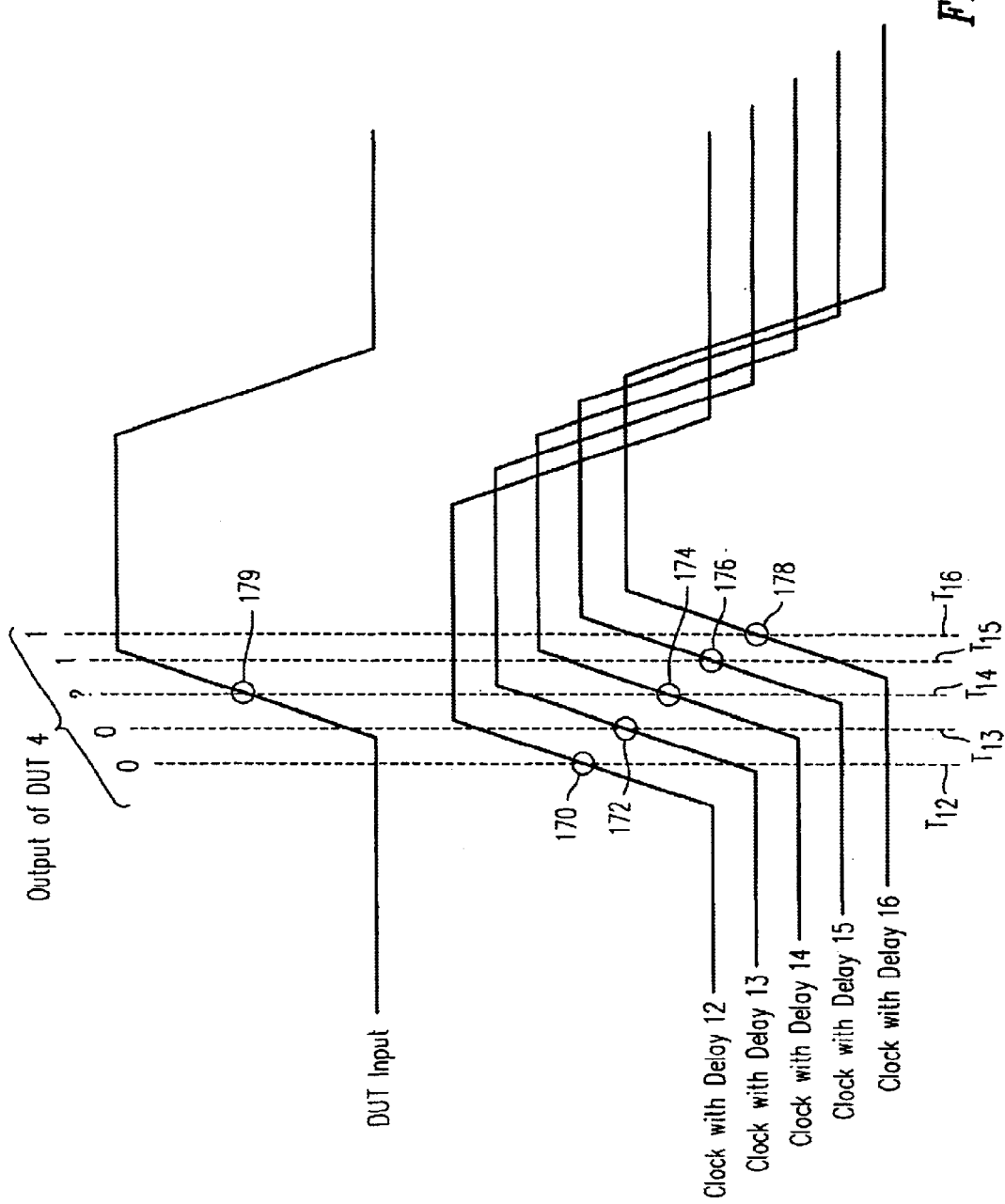
FIG. 8 shows the input signal and clock signal of the device under test and the output signals captured by a flip-flop.

FIG. 8 shows the timing diagram of the input signal to DUT 4, various clock signals to DUT 4, and the output signal of DUT 4 when clocked by the various clock signals. At $T_{12}$ and $T_{13}$ (which correspond to delay 12 and 13 set by variable clock delay 12), respective clock signal edges 170 and 172 arrive at flip-flop 6 sufficiently prior to data signal edge 179 to satisfy the setup time and the hold time of DUT 4 so that the output signal of DUT 4 is always logic "0" when recorded by flip-flop 6 at the propagation delay of one clock cycle. At $T_{14}$, clock signal edge 174 arrives at DUT 4 at substantially the same time as data signal edge 179 so that the setup time or the hold time of DUT 4 is violated. Thus, the output signal of DUT 4 varies between "1" and "0" (represented by "?" in the output of DUT 4 in FIG. 8) when recorded by flip-flop 6 at the propagation delay. At $T_{15}$ and $T_{16}$, respective clock signal edges 176 and 178 arrive at DUT 4 sufficiently after data signal edge 179 to satisfy the setup time and the hold time of DUT 4 so that the output signal of DUT 4 is always logic "1" when recorded by flip-flop 6 at extended delay $T_{D2}$. In this timing diagram, the sum of the setup time and the hold time is at most the difference between $T_{13}$ and $T_{15}$ (corresponding to delays 13 and 15 set by variable clock delay 12). The exact sum of the setup time and hold time of DUT 4 is the difference between delay 15 and delay 13.

Figure 9:
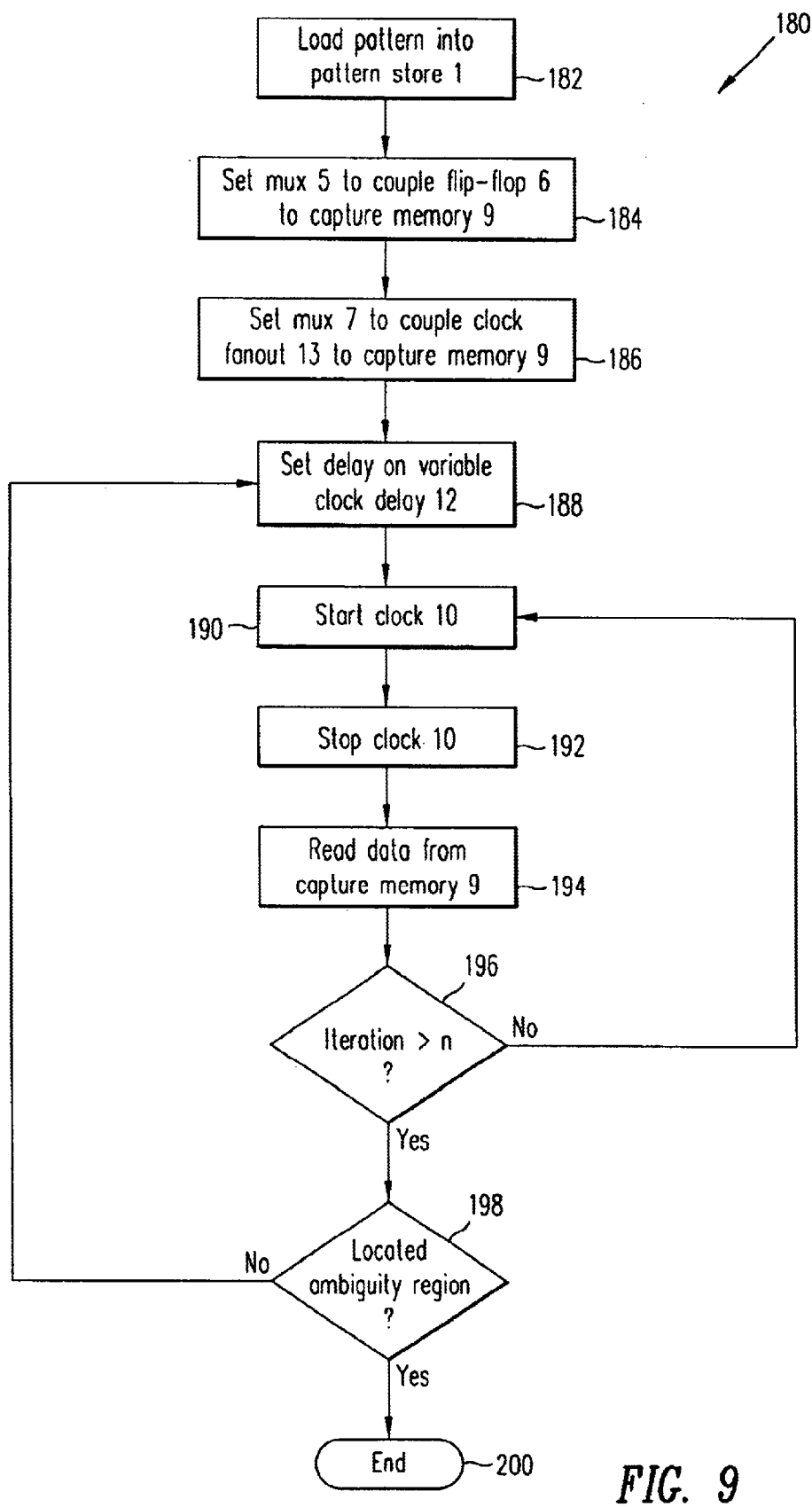
FIG. 9 illustrates a method to compare setup time and hold time of devices under test in accordance with one embodiment.

FIG. 9 illustrates a method 180 to compare the setup time and the hold time of DUTs. In action 182, computer 16 loads test patterns into pattern store 1. In action 184, computer 16 sets mux 5 to couple line 44 of D flip-flop 6 to terminal 50 of capture memory 9. In action 186, computer 16 sets mux 7 to couple line 72 of clock fanout 13 to clock terminal 80 of capture memory 9. In action 188, an operator of test apparatus 100 manually sets the delay of variable clock delay 12 by turning the vernier screw adjustment mechanism. Alternatively, a stepper motor controlled by computer 16 can be coupled to turn the vernier screw adjustment mechanism of variable clock delay 12.

In action 190, computer 16 causes clock 10 to clock the other components. In action 192, computer 16 causes clock 10 to terminate the clocking of the other components after a predetermined amount of time. Computer 16 causes clock 10 to terminate the clocking of the other components after, for example, three clock cycles. At a first clock signal edge, pattern store 1 outputs a logic state of the test pattern. At a second clock signal edge, D flip-flop 2 outputs the logic state of the test pattern to DUT 4. After a delay to the second clock signal edge generated by variable clock delay 12, D flip-flop 6 captures the output signal of DUT 4. A clock cycle after that (at a delayed third clock signal edge), capture memory 9 records the output signal of D flip-flop 6.

In action 194, computer 16 reads the recorded data from capture memory 9. As capture memory 9 is clocked by clock 10, capture memory 9 stores a set of three logic states where the last logic state is the test result. Each time the test is repeated, capture memory 9 stores another set of three logic states. By comparing the last logic state between the sets from all the tests at this delay setting of variable clock delay 12, it can be determined whether or not this delay setting correspond to a point in the ambiguity region (the sum of the setup time and hold time) of DUT 4 at the propagation delay of one clock cycle. For example, if the last logic state varies between the sets, then this delay corresponds to a point in the ambiguity region shown in FIG. 8.

In action 196, computer 16 determines if the nth iteration of testing has been performed. As previously described, n is for example 100. Thus, at each delay setting of variable clock delay 12, 100 iterations of the test is run. If the current iteration is less than n, than action 196 is followed by action 190 and the previously described actions cycle until n iterations have been completed. Otherwise, action 196 is followed by action 198.

In action 198, computer 16 determines if the ambiguity region has been located. The ambiguity region has been located if a delay setting generates test results that are all one logic state (e.g., $T_{13}$ of FIG. 8) and another delay setting generates test results that are all another logic state (e.g., $T_{16}$ of FIG. 8). If the ambiguity region has been located, action 198 is followed by action 200, which ends method 180. Otherwise, action 198 is followed by action 188, which sets another delay for variable clock delay 12 and the previous described actions cycle until the ambiguity region is located.

Although embodiments of the present invention have been described in considerable detail with reference to certain versions thereof, other versions are possible. As previously described, the data paths of apparatus 100 can be calibrated to determine the precise propagation delay of DUT 4. Therefore, the spirit and scope of the appended claims should not be limited to the description of the versions depicted in the figures.

I claim:

1. An apparatus for measuring a characteristic of an electronic element under test comprising:

a strobe source having an output terminal;

a pattern source having an output terminal to be coupled to an input terminal of the element under test, and an input terminal coupled to the output terminal of the strobe source;

a variable delay having an input terminal coupled to the output terminal of the strobe source and an output terminal;

a first storage element having an input terminal to be coupled to an output terminal of the element under test, a clock terminal coupled to the output terminal of the variable delay, and an output terminal; and a second storage element having an input terminal coupled to the output terminal of the first storage element, a clock terminal coupled to the output terminal of the variable delay, and an output terminal.

2. The apparatus of claim 1, further comprising a memory having an input terminal coupled to the output terminal of the second storage element, and a clock terminal coupled to the output terminal of the variable delay.

3. The apparatus of claim 1, further comprising a delay coupled between the output terminal of the variable delay and the clock terminal of the second storage element.

4. The apparatus of claim 1, further comprising a gating device coupled between the output terminal of the variable delay and the clock terminal of the second storage element, wherein the gating device comprises:

a counter having an input terminal coupled to the output terminal of the variable delay, and an output terminal;

an AND gate having a first input terminal coupled to the output terminal of the counter, and a second input terminal coupled to the output terminal of the variable delay, and an output terminal coupled to the clock terminal of the second storage element.

5. The apparatus of claim 4, further comprising a memory having an input terminal coupled to the output terminal of the second storage element, and a clock terminal coupled to the output terminal of the gating device.

6. The apparatus of claim 5, further comprising a delay having an input terminal coupled to the output terminal of the gating device and an output terminal coupled to the clock terminal of the memory.

7. The apparatus of claim 1, wherein the strobe source comprises a gated ring oscillator.

8. The apparatus of claim 1, wherein the variable delay comprises:

a first adjustable air-dielectric delay line having a first end which is the input terminal of the variable delay, and a second end;

a second adjustable air-dielectric delay line having a first end which is the output terminal of the variable delay, and a second end;

a junction coupling the second ends of the first and the second delay lines;

a base plate, wherein the first ends of the first and the second delay lines are attached to the base plate; and a linear positioning table, wherein the coupled second ends of the first and second delay lines are attached to the linear position table.

9. The apparatus of claim 1, wherein the output terminal of the variable delay is to be coupled to a clock terminal of the element under test.

10. The apparatus of claim 9, further comprising a memory having an input terminal coupled to the output terminal of the first storage element.

11. The apparatus of claim 9, further comprising a third storage element having an input terminal coupled to a second output terminal of the pattern source, a clock terminal coupled to the output terminal of the variable delay, and an output terminal to be coupled to a clock terminal of the element under test.

12. The apparatus of claim 2, further comprising a computer having an output terminal coupled to an input terminal of the strobe source thereby to start and stop the strobing of the strobe source.

13. The apparatus of claim 12, wherein the memory has an output terminal coupled to an input terminal of the computer.

14. An apparatus for measuring a characteristic of an electronic element under test comprising:

a strobe source having an output terminal;

a pattern source having an output terminal to be coupled to an input terminal of the element under test, and an input terminal coupled to the output terminal of the strobe source;

a variable delay having an input terminal coupled to the output terminal of the strobe source, and an output terminal to be coupled to a clock terminal of the element under test; and a first storage element having an input terminal to be coupled to an output terminal of the element under test, a clock terminal coupled to the output terminal of the variable delay, and an output terminal.

15. The apparatus of claim 14, further comprising a memory having an input terminal coupled to the output terminal of the first storage element, and a clock terminal coupled to the output terminal of the variable delay.

16. The apparatus of claim 14, further comprising a second storage element having an input terminal coupled to a second output terminal of the pattern source, a clock terminal coupled to the output terminal of the variable delay, and an output terminal to be coupled to a clock terminal of the element under test.

17. The apparatus of claim 14, wherein the strobe source comprises a gated ring oscillator.

18. The apparatus of claim 14, wherein the variable delay comprises:

a first adjustable air-dielectric delay line having a first end which is the input terminal of the variable delay, and a second end;

a second adjustable air-dielectric delay line having a first end which is the output terminal of the variable delay, and a second end;

a junction coupling the second ends of the first and the second delay lines;

a base plate, wherein the first ends of the first and the second delay lines are attached to the base plate; and a linear positioning table, wherein the coupled second ends of the first and second delay lines are attached to the linear position table.

19. The apparatus of claim 14, further comprising a second storage element having an input terminal coupled to the output terminal of the first storage element, a clock terminal coupled to the output terminal of the clock delay, and an output terminal coupled to the input terminal of the capture memory.

20. The apparatus of claim 15, further comprising a computer having an output terminal coupled to an input terminal of the strobe source thereby to start and stop the strobe source.

21. The apparatus of claim 20, wherein the capture memory has an output terminal coupled to an input terminal of the computer.

22. A method for measuring a characteristic of an electronic element under test comprising the acts of:

supplying an input signal to the element under test at a first time;

propagating a resulting output signal of the element under test via a first storage element at a second time subsequent to the first time;

propagating an output signal of the first storage element via a second storage element at a third time subsequent to the second time; and storing the output signal of the second storage element at a fourth time subsequent to the third time.

23. The method of claim 22, further comprising repeating the acts of claim 22.

24. The method of claim 22, further comprising the act of changing the amount of time between the first and second times and repeating the acts of claim 22.

25. A method for measuring a characteristic of an electronic element under test comprising the acts of:

supplying an input signal to the element under test at a first time;

clocking the element under test at a second time subsequent to the first time;

propagating an output signal of the element under test via a storage element at a third time subsequent to the second time; and storing the output signal of the first storage element at a fourth time subsequent to the third time.

26. The method of claim 25, further comprising repeating the acts of claim 25.

27. The method of claim 25, further comprising the act of changing the amount of time between the first and the second times and repeating the acts of claim 25.

* * * * *